United States Patent [19]

Tilghman et al.

[11] Patent Number: 5,430,882
[45] Date of Patent: Jul. 4, 1995

[54] APPARATUS AND METHOD FOR PROTECTING DATA STORED IN MEMORY

[75] Inventors: Stephen E. Tilghman; Kevin D. Fink; Roger M. Lewis, all of Duncan, Okla.

[73] Assignee: Halliburton Company, Duncan, Okla.

[21] Appl. No.: 914,917

[22] Filed: Jul. 14, 1992

[51] Int. Cl.⁶ .................................................. G06F 1/30
[52] U.S. Cl. .................................. 395/750; 395/575; 395/425; 364/422
[58] Field of Search ................ 395/750, 375, 425; 364/273.4, DIG. 1, 422, 945.3, 948.5, DIG. 2; 365/228; 371/14, 66

[56] References Cited

U.S. PATENT DOCUMENTS

| | | | |
|---|---|---|---|
| 4,096,560 | 6/1978 | Footh | 395/575 |
| 4,131,942 | 12/1978 | Gillett et al. | 364/DIG. 1 |
| 4,335,371 | 6/1982 | Connolly, Jr. et al. | 340/347 CC |
| 4,458,307 | 7/1984 | McAnlis et al. | 364/DIG. 1 |
| 4,485,456 | 11/1984 | Toyoda | 395/425 |
| 4,534,018 | 8/1985 | Elkert et al. | 365/228 |
| 4,611,289 | 9/1986 | Coppola | 364/492 |
| 4,827,149 | 5/1989 | Yabe | 307/64 |
| 5,175,845 | 12/1992 | Little | 395/550 |

*Primary Examiner*—Jack B. Harvey
*Assistant Examiner*—Glenn A. Auve
*Attorney, Agent, or Firm*—Stephen R. Christian; E. Harrison Gilbert, III

[57] ABSTRACT

An apparatus and method provide data security for battery backed memory during power up and power down. A reversing sequential power up and power down process is used to control the write process for the memory during the operating voltage transitions of power up and power down. The apparatus is combined in a housing with a microprocessor and a memory to provide an instrument for an oil or gas well.

15 Claims, 3 Drawing Sheets

APPARATUS AND METHOD FOR PROTECTING DATA STORED IN MEMORY

BACKGROUND OF THE INVENTION

This invention relates generally to apparatus and methods for protecting data stored in memory. In one aspect, the present invention more particularly relates to preventing spurious writes to a memory when an operating voltage is applied to or removed from the apparatus, the memory being adapted to store data in response to a control signal from a microprocessor.

Instruments of various types have memories, such as battery-backed solid state integrated circuit devices, in which data are stored under control of a write signal from a microprocessor. Such instruments are powered by electricity which typically can be turned off purposefully, such as for conserving energy, or accidentally, such as due to an outage during a storm. We have noted that when such an instrument is turned on and off, there can be generated spurious signals that adversely affect the memory whereby previously stored data can be lost.

By way of example, there are various types of surface and downhole instruments used in the oil and gas industry as data loggers in that they obtain and store data about characteristics, such as temperature and pressure, relevant to an oil or gas well. At least some modern instruments of this type have microprocessors and memories where the data are stored for later retrieval and use in analyzing the respective wells where the data were gathered. Power to energize these components is typically provided either by batteries or other power sources carried within the instruments or by external sources.

To prevent or reduce data corruption in such instruments during power up or power down electrical transitions, there is the need for an apparatus and method for protecting data stored in a memory, particularly a battery backed memory controlled by a microprocessor subject to being powered up and powered down. More particularly, there is the need in the oil and gas industry for an improved surface or downhole instrument in which existing features and advantages can still be obtained, but without corrupting data stored in memory embedded in the instrument when there is a power application or a power outage.

Although we are aware of a single chip product that purports to control voltage at power up, we are not aware of an apparatus or method which achieves data protection during both power up and power down in the manner of the present invention.

SUMMARY OF THE INVENTION

The present invention overcomes the above-noted and other shortcomings of the prior art and meets the aforementioned needs by providing a novel and improved apparatus and method for protecting data stored in a memory. The present invention also provides a novel and improved instrument for an oil or gas well.

In the preferred embodiments described below, the present invention provides data security for battery backed memory during power up and power down. In particular, reversing sequential control of a reset signal for a microprocessor and of a write enable signal for a battery backed memory occurs during the voltage transitions of powering up and powering down the microprocessor.

Generally, the present invention provides an apparatus for protecting data stored in a memory of a data storage system, comprising: means for determining when the data storage system is energized and de-energized; and reversing sequential control means, responsive to the means for determining, for first changing a control signal to the data storage system and thereafter changing a control signal to the memory in response to the data storage system being energized and for first changing the control signal to the memory and thereafter changing the control signal to the data storage system in response to the data storage system being de-energized. More particularly, the present invention provides an apparatus for preventing spurious writes to a memory when an operating voltage is applied to or removed from the apparatus, the memory being adapted to store data in response to a control signal from a microprocessor, the apparatus comprising: voltage threshold means for sensing when the operating voltage has increased to a predetermined energizing voltage threshold and for sensing when the operating voltage has decreased to a predetermined de-energizing voltage threshold; means, responsive to the voltage threshold means, for removing a microprocessor reset logic level at a first time after the voltage threshold means senses the operating voltage has increased to the predetermined energizing voltage threshold; means for enabling a write input of the memory at a second time, occurring after the first time, in response to the removal of the microprocessor reset logic level; means, responsive to the voltage threshold means, for disabling the write input of the memory at a third time, occurring after the voltage threshold means senses the operating voltage has decreased to the predetermined de-energizing voltage threshold; and means for applying the microprocessor reset logic level at a fourth time, occurring after the third time.

The present invention also provides a method of protecting data stored in a memory connected to a microprocessor, comprising: determining when the microprocessor is powered up and powered down; changing a reset control signal for the microprocessor and thereafter changing a write enable control signal for the memory in response to the microprocessor being powered up; and changing the write enable control signal for the memory and thereafter changing the reset control signal for the microprocessor in response to the microprocessor being powered down.

The present invention further provides an instrument for an oil or gas well, comprising: a housing; a data storage memory in the housing; a microprocessor connected to the memory in the housing; means for providing electrical energy to the microprocessor; and data protection means, connected to the memory and the microprocessor in the housing, for reversibly providing sequential control signals to the microprocessor and the memory to protect data stored in the memory when the microprocessor is powered up and powered down from the means for providing electrical energy.

Therefore, from the foregoing, it is a general object of the present invention to provide a novel and improved apparatus and method for protecting data stored in a memory. Other and further objects, features and advantages of the present invention will be readily apparent to those skilled in the art when the following description of the preferred embodiments is read in conjunction with the accompanying drawings.

BRIEF DESCRIPTION OF THE DRAWINGS

FIG. 5 is a schematic circuit diagram of a more preferred embodiment of the data protection apparatus of the present invention, to which the timing diagram of FIG. 4 is also applicable.

DETAILED DESCRIPTION OF PREFERRED EMBODIMENTS

Although the present invention broadly pertains to an apparatus and method for protecting data stored in a memory regardless of the particular environment in which it is used, the present invention also pertains specifically to an instrument for an oil or gas well. The instrument can be a surface device or a downhole tool. Such an instrument will typically be used for sensing and recording data, such as pressure and temperature. An example of a specific downhole tool that we contemplate can be adapted to embody the present invention is the downhole memory gauge disclosed in U.S. Pat. No. 4,866,607 to Anderson et al., incorporated herein by reference.

Figure 1:
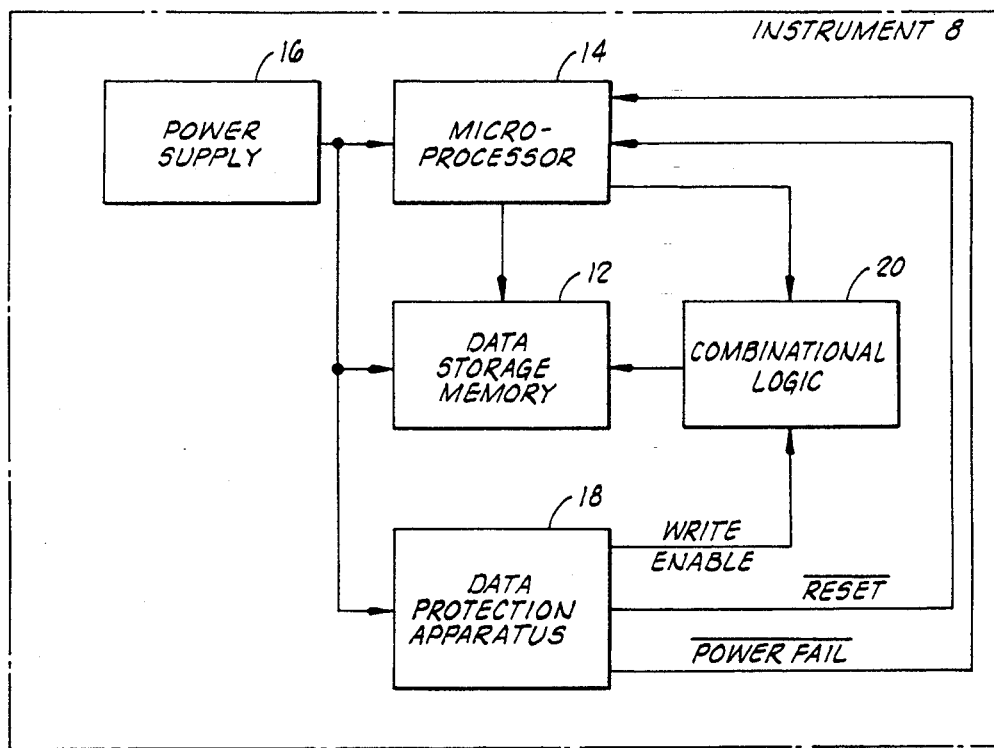
FIG. 1 is a block diagram of elements of an instrument pertinent to the present invention.

Referring to FIG. 1, an instrument 8 of the present invention comprises a housing 10, a data storage memory 12 mounted in the housing 10, and a microprocessor 14 connected to the memory 12 in the housing 10. The instrument 8 further comprises means for providing electrical energy to the memory 12 and the microprocessor 14. The means for providing electrical energy can include a power supply 16, such as batteries, located within the instrument 8. The means for providing electrical energy can also be externally implemented. The foregoing elements of the instrument 8 are, in its preferred embodiment, implemented with conventional components as known in the art. For example, the memory 12 can be implemented with an integrated circuit memory device requiring battery backup power from the power supply 16, and the microprocessor 14 can be implemented in a conventional integrated circuit chip embodiment.

Although not shown in FIG. 1, the instrument 8 of the preferred embodiment will also include other components, such as one or more transducers or sensors which detect characteristics (for example, pressure and temperature) and provide electrical signals for processing by the microprocessor 14 into data signals stored in the memory 12 under control by the microprocessor 14 operating in response to a program stored in other memory within the instrument 8.

Still referring to FIG. 1, the instrument 8 further comprises a data protection apparatus 18, connected to the memory 12 and the microprocessor 14 in the housing 10. The apparatus 18 reversibly provides sequential control signals to the microprocessor 14 and the memory 12 to protect data stored in the memory 12 when the microprocessor 14 is powered up and powered down from the means for providing electrical energy. As shown in FIG. 1, the data protection apparatus 18 provides a power fail indicating signal ($\overline{\text{POWER FAIL}}$) to the microprocessor 14 (such as specifically to an interrupt input or a data port thereof). The data protection apparatus 18 also provides a reset control signal ($\overline{\text{RESET}}$) for the microprocessor 14; this can be used directly as shown in FIG. 1 or in conjunction with other reset control signals that might be provided within a particular instrument. The data protection apparatus 18 also provides a write enable control signal (WRITE ENABLE) that enables combinational logic 20 (for example, an AND logic gate) to which a conventional write enable signal from the microprocessor 14 is also provided. The output of combinational logic 20 is connected to the write enable input of the memory 12. The purpose of these signals will be further explained following a description of the embodiment of the data protection apparatus 18 shown in FIG. 3.

Figure 2:
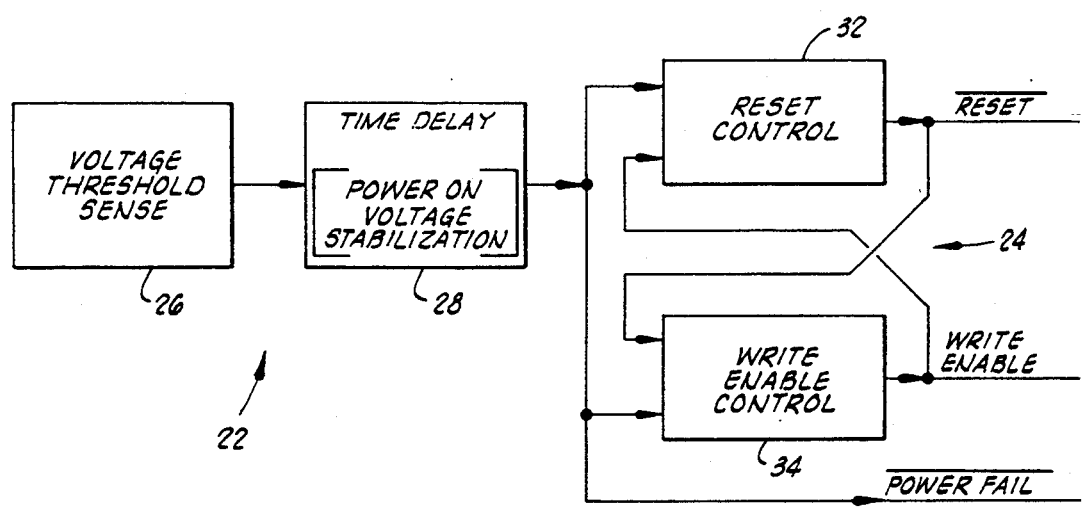
FIG. 2 is a block diagram of the data protection apparatus depicted in FIG. 1.

Referring first to FIG. 2, the apparatus 18 broadly includes means 22 for determining when the data storage system is energized and de-energized. This determination is specifically made by sensing the system voltage as it is applied to the apparatus 18 itself. The apparatus 18 also broadly includes reversing sequential control means 24 for first changing a control signal to the data storage system and thereafter changing a control signal to the memory in response to the data storage system being energized and for first changing the control signal to the memory and thereafter changing the control signal to the data storage system in response to the data storage system being de-energized.

The energizing/de-energizing determining means 22 includes a voltage threshold sensing device 26 and a time delay circuit 28 connected to the voltage threshold device 26. The output of the time delay circuit 28 provides the $\overline{\text{POWER FAIL}}$ signal shown in FIGS. 1 and 2. This time delay allows for voltage stabilization. This signal controls the reversing sequential control means 24.

The reversing sequential control means 24 includes reset control means 32 for switching the logic level of the control signal to the data storage system (namely, the $\overline{\text{RESET}}$ signal for the microprocessor 14 in FIG. 1) in response to the data storage system being energized. The reversing sequential control means 24 also includes write enable control means 34 for switching the logic level of the control signal to the memory (namely, the WRITE ENABLE signal for the memory 12 in FIG. 1) in response to the reset control means 32 first switching the logic level of the control signal to the data storage system. The write enable control means 34 also re-switches the logic level of the control signal to the memory in response to the data storage system being de-energized. In conjunction with this latter feature, the reset control means 32 re-switches the logic level of the control signal to the data storage system in response to the write enable control means 34 first re-switching the logic level of the control signal to the memory. In correspondence to the switching sequence of the control signals just described relative to first responding to a power up and then a power down, the reset control means 32 can also be referred to as a first-second switching means, and the write enable control means 34 can be referred to as a second-first switching means.

Figure 3:
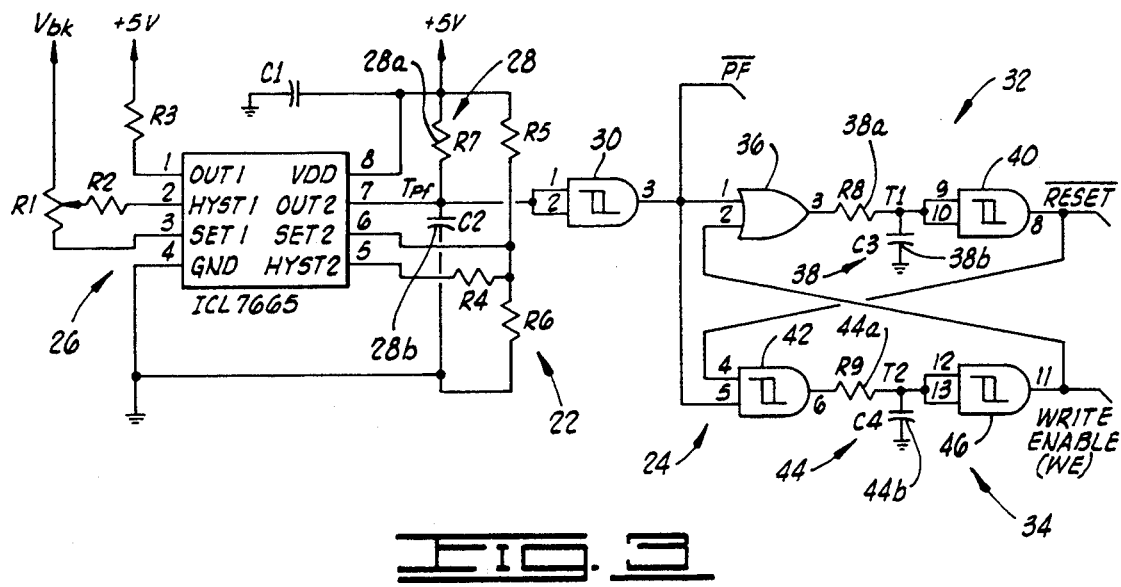
FIG. 3 is a schematic circuit diagram of a preferred embodiment of the data protection apparatus of the present invention.

Referring now to FIG. 3, the energizing/de-energizing determining means 22 senses when the operating voltage provided by the power supply 16 (namely, nominally +5 V as labeled in FIG. 3 and as also labeled VCC in FIG. 4) has increased to a predetermined energizing voltage threshold, and it senses when the operating voltage has decreased to a predetermined de-energizing voltage threshold. Such voltage thresholds are identified in FIG. 4 as Vth(on) and Vth(off), respectively. These can be at the same or different voltage levels and are based on the operating characteristics of specific devices selected for implementing the apparatus 18. These are typically less than the nominal voltage value.

The time delay circuit 28 of the FIG. 3 embodiment includes a resistor 28a and a capacitor 28b connected between operating voltage and ground and having a common node connected to an output of the voltage threshold device 26 and the input of a buffer 30. The buffer 30 is implemented in the FIG. 3 embodiment by an AND logic gate.

The reset control or first-second switching means 32 of the FIG. 3 embodiment includes a combinational logic circuit comprising an OR logic gate 36, a time delay circuit 38 connected to the output of the OR logic gate 36; and a buffer gate 40 (implemented by an AND logic gate) having an input connected to the time delay circuit 38. The reset control signal ($\overline{\text{RESET}}$) is provided at the output of the buffer gate 40. An input of the OR logic gate 36 is connected to the output of the buffer gate 30 from which the power fail signal ($\overline{\text{PF}}$) is provided. The time delay circuit 38 includes a resistor 38a connected between the output of the OR gate 36 and the input of the buffer gate 40, and it includes a capacitor 38b connected between the resistor 38a/buffer gate 40 input junction and electrical ground.

The write enable control or second-first switching means 34 of the FIG. 3 embodiment includes a second combinational logic circuit comprising an AND logic gate 42, a time delay circuit 44 connected to the output of the AND logic gate 42, and a buffer gate 46 (implemented by an AND logic gate) having an input connected to the time delay circuit 44. The buffer gate 46 also has an output from which the write enable control signal (WE) is provided. This output of the buffer gate 46 is connected to another input of the OR logic gate 36 and the buffer gate 40 has its output connected to an input of the AND logic gate 42 so that the two switching means 32, 34 provide control signals to each other. The AND logic gate 42 also has an input connected to the output of the buffer gate 30 providing the power fail signal. The time delay circuit 44 includes a resistor 44a connected between the output of the AND gate 42 and the input of the buffer gate 46, and it includes a capacitor 44b connected between the resistor 44a/buffer gate 46 input junction and electrical ground.

The operation of the embodiment of FIG. 3 will next be described also with reference to the timing diagram of FIG. 4 and with the assumption that the apparatus is connected in the instrument 8 of FIG. 1. When the operating voltage, VCC, from the power supply 16 rises from a powered down state to the power up threshold voltage Vth(on), output "OUT2" of the particular voltage threshold device 26 identified in FIG. 3 provides an open collector in response to internal signal Vth(logic). This allows the capacitor 28b of the time delay network 28 to charge through resistor 38a so that increasing signal Tpf is provided at the input to the buffer gate 30, from the output of which the power fail signal, $\overline{\text{PF}}$, is responsively provided. Delay td(on) shown in FIG. 4 between Vth(on) and the beginning of the logic level change in $\overline{\text{PF}}$, as brought about by Tpf, cleans up "switch bounce" that can occur when the power supply 16 switches on to provide operating voltage.

Figure 4:
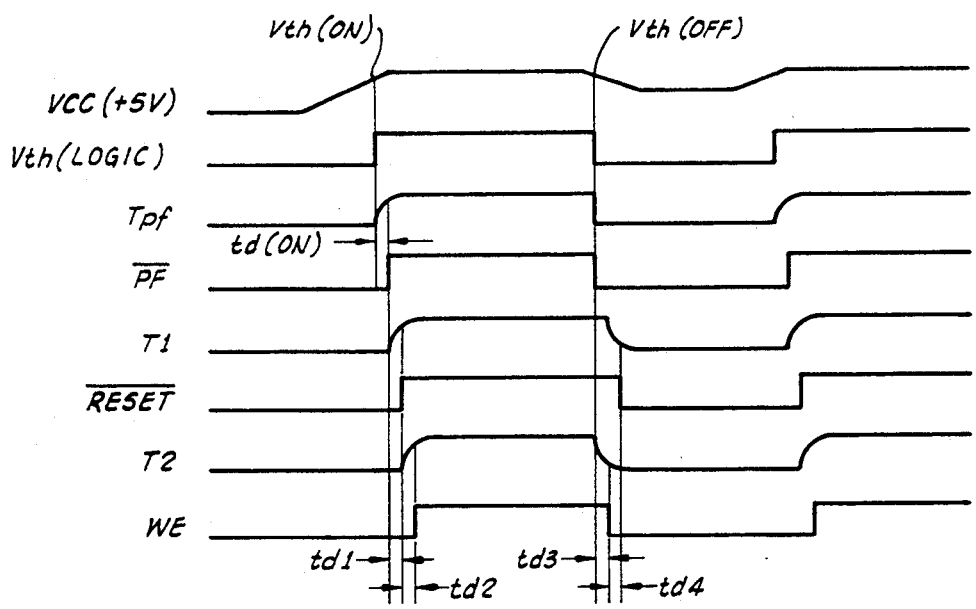
FIG. 4 is a timing diagram of signals for the data protection apparatus shown in FIG. 3.
Figure 3:
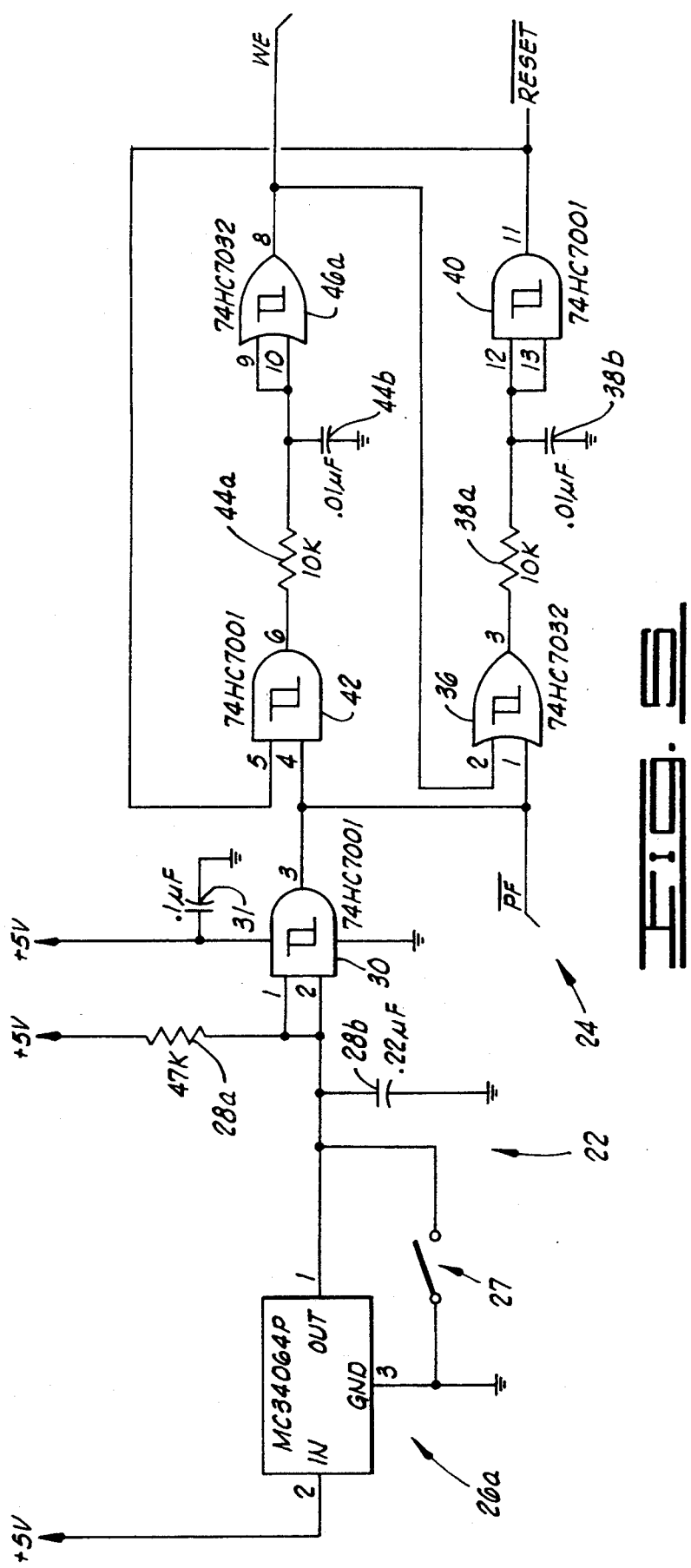

Switching of $\overline{\text{PF}}$ to the high logic level illustrated in FIG. 4 causes signal T1 to change as shown in FIG. 4. Specifically, the high logic level of $\overline{\text{PF}}$ propagates through the OR gate 36 and charges the capacitor 38b of the delay network 38. When T1 reaches the logic threshold level for the input of the buffer gate 40, the $\overline{\text{RESET}}$ signal at the output of the buffer gate 40 switches from a low logic level to a high logic level, thereby removing the low logic level reset control from the microprocessor 14 at a time delay td1 after the $\overline{\text{PF}}$ signal changed to its high logic level. This time delay allows for system stabilization.

When $\overline{\text{RESET}}$ switches to a high logic level that allows the microprocessor 14 to operate, the output of the AND gate 42 switches to a high logic level because the other input of the AND gate 42 is also at a high logic level due to the $\overline{\text{PF}}$ signal being provided to this input. This high logic level output of AND gate 42 charges the capacitor 44b of the time delay network 44 so that signal T2 responsively changes as shown in FIG. 4. When T2 reaches the threshold of the buffer gate 46, the output of the buffer gate 46 changes to a high logic level. This provides the write enable control signal (WE) for use with combinational logic 20 as illustrated in FIG. 1 to allow data to be written or stored in the memory 12 in a thereafter conventional manner. The delay td2 implemented via the time delay network 44 gives time for the microprocessor 14 to respond to or become stabilized after the previously occurring changes to the $\overline{\text{PF}}$ and $\overline{\text{RESET}}$ signals.

The resetting logic level of the $\overline{\text{RESET}}$ signal remains removed from the microprocessor 14 (that is, $\overline{\text{RESET}}$ remains at a high logic level for the FIG. 3 implementation) and the write enabling logic level of the WE signal remains (that is, WE also remains at a high logic level for the FIG. 3 implementation) as long as the energized/de-energized determining means 22 senses that VCC remains above the de-energizing threshold Vth(off). When VCC drops below this level, the following signal changes occur as shown in FIG. 4.

When VCC drops below Vth(off), Tpf immediately drops to its low logic level as the capacitor 28b is discharged through a transistor at the "OUT2" output of the voltage threshold device 26, which transistor is made conductive to ground in response to the Vth(logic) signal going low upon Vth(off) being sensed. This in turn switches $\overline{\text{PF}}$ to its low logic level. This low logic level switches the output of the AND gate 42 to its low logic level and thereby discharges the capacitor 44b so that T2 begins decreasing as shown in FIG. 4. After delay td3, during which the microprocessor 14 can properly respond to the $\overline{\text{PF}}$ signal indicating to it that power is going down (which is a type of procedure known in the art), the output of the buffer gate 46 changes to its low logic level so that WE in this low logic state disables combinational logic 20 and thereby prevents further writes to the memory 12.

When WE goes to its low logic level, the $\overline{\text{RESET}}$ signal also goes low after time delay td4 as shown in FIG. 4. This occurs because both inputs to the OR gate 36 are then at low logic levels, whereby the resulting low logic level output of the OR gate 36 discharges the capacitor 38b as reflected in the decreasing portion of T1 in FIG. 4. At the point when the discharging signal T1 reaches the low logic level threshold of the buffer gate 40, the output of the buffer gate 40 (and thus the RESET signal) switches to its microprocessor-resetting low logic level.

Accordingly, during power up WE is not switched to its enabling state until after the system, including the microprocessor 14, has had time to stabilize in proper operative condition, whereas during power down WE is first switched to its disabling state before the system destabilizes. In both cases this prevents spurious writing to the memory 12, thereby preventing previously stored data from being corrupted. It is to be noted that during power down the sequence of the changes to $\overline{\text{RESET}}$ and WE is reversed from the order of their changes during power up.

From the foregoing it is apparent that the first-second switch means 32 shown in FIG. 3 is a particular embodiment of the first and fourth elements of the following definition and that the second-first switch means 34 shown in FIG. 3 is a particular embodiment of the second and third elements of the following definition: (1) means, responsive to a voltage threshold means, for removing a microprocessor reset logic level at a first time after the voltage threshold means senses an operating voltage has increased to a predetermined energizing voltage threshold; (2) means for enabling a write input of a memory at a second time, occurring after the first time, in response to the removal of the microprocessor reset logic level; (3) means, responsive to the voltage threshold means, for disabling the write input of the memory at a third time, occurring after the voltage threshold means senses the operating voltage has decreased to a predetermined de-energizing voltage threshold; and (4) means for applying the microprocessor reset logic level at a fourth time, occurring after the third time.

To achieve the time delays described hereinabove, resistors and capacitors of suitable values can be used; however, it is contemplated that preferred selections will produce td1, td2, td3, and td4 delays of microseconds and the initial debounce delay td(on) of 50+ milliseconds. It is also preferred that the AND gates shown in FIG. 3 be Schmitt trigger devices to minimize switching problems with the time delay circuits.

The foregoing embodiment has been described using positive logic levels, which is preferred because of better switching characteristics than for negative logic levels; however, the present invention is not limited to any particular logic as it is contemplated that various equivalents can be implemented with other logic levels and schemes.

The foregoing explanation of the operation of the FIG. 3 embodiment particularly describes the method of the present invention, which method can be more broadly described as comprising: determining when the microprocessor 14 is powered up and powered down; changing the reset control signal for the microprocessor 14 and thereafter changing the write enable control signal for the memory 12 in response to the microprocessor 14 being powered up; and changing the write enable control signal for the memory 12 and thereafter changing the reset control signal for the microprocessor 14 in response to the microprocessor 14 being powered down. Determining when the microprocessor is powered up and powered down includes sensing when an operating voltage has increased to a predetermined energizing voltage threshold and sensing when the operating voltage has decreased to a predetermined de-energizing voltage threshold. Changing the reset control signal and thereafter changing the write enable control signal includes first switching the logic level of the reset control signal and a predetermined time thereafter switching the logic level of the write enable control signal; and changing the write enable control signal and thereafter changing the reset control signal includes re-switching the logic level of the write enable control signal and a predetermined time thereafter re-switching the logic level of the reset control signal.

A more preferred embodiment of the invention is shown in FIG. 5. The operation of this embodiment is the same as for the embodiment of FIG. 3; therefore, the timing diagram of FIG. 4 also applies to the FIG. 5 embodiment. The FIG. 5 implementation is of the same type as the FIG. 3 implementation as indicated by like reference numerals. Implementation differences for the FIG. 5 embodiment include a simplified embodiment of the voltage threshold circuit 26a as indicated in FIG. 5, the addition of a manual reset switch 27, the addition of a capacitor 31 to the buffer gate 30, the use of Schmitt trigger OR gates as well as Schmitt trigger AND gates (Schmitt trigger devices are preferred, but not required), and the use of such an OR gate instead of an AND gate for the buffer gate 46 (either type of gate can be used for the buffers). The simplified implementation for the voltage threshold circuit 26a precludes the use of the memory backup voltage Vbk shown in the FIG. 3 embodiment (Vbk denotes a backup voltage from the power supply 16 used to maintain the memory 12 during a power down phase; Vbk can also be used for energizing the apparatus 18).

Thus, the present invention is well adapted to carry out the objects and attain the ends and advantages mentioned above as well as those inherent therein. While preferred embodiments of the invention have been described for the purpose of this disclosure, changes in the construction and arrangement of parts and the performance of steps can be made by those skilled in the art, which changes are encompassed within the spirit of this invention as defined by the appended claims.

What is claimed is:

1. An apparatus for protecting data stored in a memory of a data storage system, said apparatus comprising:
   means for determining when the data storage system is energized and de-energized; and
   reversing sequential control means, responsive to said means for determining, for first changing a control signal to the data storage system and thereafter changing a control signal to the memory solely in response to the data storage system being energized and for first changing the control signal to the memory and thereafter changing the control signal to the data storage system solely in response to the data storage system being de-energized.

2. An apparatus as defined in claim 1, wherein said means for determining is responsive to voltage.

3. An apparatus for protecting data stored in a memory of a data storage system, said apparatus comprising:
   means for determining when the data storage system is energized and de-energized; and
   reversing, sequential control means, responsive to said means for determining, for first changing a control signal to the data storage system and thereafter changing a control signal to the memory in response to the data storage system being energized and for first changing the control signal to the memory and thereafter changing the control signal to the data storage system in response to the data storage system being de-energized, said reversing sequential control means including:

first-second switching means for switching a logic level of the control signal to the data storage system in response to the data storage system being energized;

second-first switching means for switching a logic level of the control signal to the memory in response to said first-second switching means first switching the logic level of the control signal to the data storage system in response to the data storage system being energized, and for re-switching the logic level of the control signal to the memory in response to the data storage system being de-energized; and wherein said first-second switching means re-switches the logic level of the control signal to the data storage system in response to said second-first switching means first re-switching the logic level of the control signal to the memory in response to the data storage system being de-energized.

4. An apparatus as defined in claim 3, wherein:
said first-second switching means includes a first combinational logic circuit; and
said second-first switching means includes a second combinational logic circuit.

5. An apparatus as defined in claim 4, wherein:
said first combinational logic circuit includes:
an OR logic gate having first and second inputs and an output, said first input connected to said means for determining;
a first time delay circuit, connected to said output of said OR logic gate; and
a first buffer gate having an input connected to said first time delay circuit; and
said second combinational logic circuit includes:
an AND logic gate having first and second inputs and an output, said first input of said AND logic gate connected to said means for determining and said second input of said AND logic gate connected to an output of said first buffer gate;
a second time delay circuit, connected to said output of said AND logic gate; and
a second buffer gate having an input connected to said second time delay circuit and having an output connected to said second input of said OR logic gate.

6. An apparatus as defined in claim 5, wherein said means for determining includes:
a voltage threshold device;
a third time delay circuit, connected to said voltage threshold device; and
a third buffer gate having an input connected to said third time delay circuit and having an output connected to said first inputs of said OR and AND logic gates.

7. An apparatus for preventing spurious writes to a memory when an operating voltage is applied to or removed from the apparatus, the memory being adapted to store data in response to a control signal from a microprocessor, said apparatus comprising:

voltage threshold means for sensing when the operating voltage has increased to a predetermined energizing voltage threshold and for sensing when the operating voltage has decreased to a predetermined de-energizing voltage threshold;

means, responsive to said voltage threshold means, for removing a microprocessor reset logic level at a first time after said voltage threshold means senses the operating voltage has increased to the predetermined energizing voltage threshold;

means for enabling a write input of the memory at a second time, occurring after said first time, in response to the removal of the microprocessor reset logic level;

means, responsive to said voltage threshold means, for disabling the write input of the memory at a third time, occurring after said voltage threshold means senses the operating voltage has decreased to the predetermined de-energizing voltage threshold; and means for applying the microprocessor reset logic level at a fourth time, occurring after said third time, in response to the disabling of the write input.

8. An apparatus as defined in claim 7, wherein said voltage threshold means includes:
a voltage threshold device;
a resistor-capacitor network connected to said voltage threshold device; and
a buffer connected to said resistor-capacitor network.

9. An apparatus as defined in claim 7, wherein:
said means for removing a microprocessor reset logic level at a first time includes:
an OR logic gate having first and second inputs and an output, said first input connected to said voltage threshold means;
a first time delay circuit, connected to said output of said OR logic gate;
a first buffer gate having an input connected to said first time delay circuit; and
wherein said OR logic gate, said first time delay circuit and said first buffer gate are also included in said means for applying the microprocessor reset logic level at a fourth time; and said means for enabling a write input of the memory at a second time includes:
an AND logic gate having first and second inputs and an output, said first input of said AND logic gate connected to said voltage threshold means and said second input of said AND logic gate connected to an output of said first buffer gate;
a second time delay circuit, connected to said output of said AND logic gate;
a second buffer gate having an input connected to said second time delay circuit and having an output connected to said second input of said OR logic gate; and
wherein said AND logic gate, said second time delay circuit and said second buffer gate are also included in said means for disabling the write input of the memory at a third time.

10. An instrument for an oil or gas well, comprising:
a housing;
a data storage memory in said housing;
a microprocessor connected to said memory in said housing;
means for providing electrical energy to said microprocessor; and
data protection means connected to said memory and said microprocessor in said housing, said data protection means including:
means for determining when the microprocessor is powered up and Dowered down; and reversing sequential control means, responsive to said means for determining, for first changing a control signal to the microprocessor and thereafter changing a control signal to the memory in response to the microprocessor being powered up and for first changing the control signal to the memory and thereafter changing the control signal to the microprocessor in response to the microprocessor being de-energized, said reversing sequential control means including:

first-second switching means for switching a logic level of the control signal to the microprocessor in response to the microprocessor being powered up;

second-first switching means for switching a logic level of the control signal to the memory in response to said first-second switching means first switching the logic level of the control signal to the microprocessor, and for re-switching the logic level of the control signal to the memory in response to the microprocessor being de-energized; and wherein said first-second switching means re-switches the logic level of the control signal to the microprocessor in response to said second-first switching means first re-switching the logic level of the control signal to the memory.

11. An instrument as defined in claim 10, wherein: said first-second switching means includes:

an OR logic gate having first and second inputs and an output, said first input connected to said means for determining;

a first time delay circuit, connected to said output of said OR logic gate; and a first buffer gate having an input connected to said first time delay circuit; and said second-first switching means includes:

an AND logic gate having first and second inputs and an output, said first input of said AND logic gate connected to said means for determining and said second input of said AND logic gate connected to an output of said first buffer gate;

a second time delay circuit, connected to said output of said AND logic gate; and a second buffer gate having an input connected to said second time delay circuit and having an output connected to said second input of said OR logic gate.

12. An instrument as defined in claim 11, wherein said means for determining includes:

a voltage threshold device;

a third time delay circuit, connected to said voltage threshold device; and a third buffer gate having an input connected to said third time delay circuit and having an output connected to said first inputs of said OR and AND logic gates.

13. An instrument for an oil or gas well, comprising:

a housing;

a data storage memory in said housing;

a microprocessor connected to said memory in said housing;

means for providing electrical energy to said microprocessor; and data protection means connected to said memory and said microprocessor in said housing, said data protection means including:

voltage threshold means for sensing when an operating voltage from said means for providing electrical energy has increased to a predetermined energizing voltage threshold and for sensing when the operating voltage has decreased to a predetermined de-energizing voltage threshold;

means, responsive to said voltage threshold means, for removing a microprocessor reset logic level at a first time after said voltage threshold means senses the operating voltage has increased to the predetermined energizing voltage threshold;

means for enabling a write input of the memory at a second time, occurring after said first time, in response to the removal of the microprocessor reset logic level;

means, responsive to said voltage threshold means, for disabling the write input of the memory at a third time, occurring after said voltage threshold means senses the operating voltage has decreased to the predetermined de-energizing voltage threshold; and means for applying the microprocessor reset logic level at a fourth time, occurring after said third time, in response to the disabling of the write input.

14. An instrument as defined in claim 13, wherein said voltage threshold means includes:

a voltage threshold device;

a resistor-capacitor network connected to said voltage threshold device; and a buffer connected to said resistor-capacitor network.

15. An instrument as defined in claim 13, wherein:

said means for removing a microprocessor reset logic level at a first time includes:

an OR logic gate having first and second inputs and an output, said first input connected to said voltage threshold means;

a first time delay circuit, connected to said output of said OR logic gate;

a first buffer gate having an input connected said first time delay circuit; and wherein said OR logic gate, said first time delay circuit and said first buffer gate are also included in said means for applying the microprocessor reset logic level at a fourth time; and said means for enabling a write input of the memory at second time includes:

an AND logic gate having first and second inputs and an output, said first input of said AND logic gate connected to said voltage threshold means and said second input of said AND logic gate connected to an output of said first buffer gate;

a second time delay circuit, connected to said output of said AND logic gate;

a second buffer gate having an input connected to said second time delay circuit and having an output connected to said second input of said OR logic gate; and wherein said AND logic gate, said second time delay circuit and said second buffer gate are also included in said means for disabling the write input of the memory at a third time.

* * * * *